(12) United States Patent
Kashima et al.

(10) Patent No.: US 7,038,476 B2
(45) Date of Patent: May 2, 2006

(54) ELECTRICAL SIGNAL TAKING-OUT DEVICE

(75) Inventors: Isao Kashima, Tokyo (JP); Rumiko Kashima, Tokyo (JP)

(73) Assignee: Mechano Electronic, Inc., Tokyo (JP)

( * ) Notice: Subject to any disclaimer, the term of this patent is extended or adjusted under 35 U.S.C. 154(b) by 0 days.

(21) Appl. No.: 10/831,627

(22) Filed: Apr. 23, 2004

(65) Prior Publication Data
US 2004/0232926 A1    Nov. 25, 2004

(30) Foreign Application Priority Data
Apr. 24, 2003  (JP) .............................. 2003-120511

(51) Int. Cl.
*G01R 31/12*  (2006.01)
*G01D 11/30* (2006.01)

(52) U.S. Cl. .................. 324/754; 324/158.1; 174/194; 73/866.5

(58) Field of Classification Search ................ 174/194; 324/750–765; 73/866.5
See application file for complete search history.

(56) References Cited

U.S. PATENT DOCUMENTS

| | | | |
|---|---|---|---|
| 6,307,158 | B1 | 10/2001 | Kashima et al. |
| 6,463,818 | B1 * | 10/2002 | Stagg et al. ............... 73/866.5 |
| 2003/0143889 | A1 * | 7/2003 | Kashima et al. ............ 439/482 |

FOREIGN PATENT DOCUMENTS

| | | |
|---|---|---|
| JP | 2000-356649 | 12/2000 |
| JP | 2001-021582 | 1/2001 |
| JP | 2002-122615 | 4/2002 |

* cited by examiner

*Primary Examiner*—Vinh Nguyen
*Assistant Examiner*—Emily Y Chan

(57) ABSTRACT

An electrical signal taking-out device is disclosed which is less subject to external electromagnetic waves and which is capable of obtaining a proper wave form and a properly measured value. The device includes a pair of metal wires, a metal retaining member for holding the metal wires to permit grip portions of the metal wires disposed at distal ends thereof to be opened and closed, and an actuating mechanism for actuating the metal wires to open and close the grip portions of the metal wires, whereby electrical signals taken out by the metal wires are adapted to be inputted to measuring equipment through the retaining member.

12 Claims, 4 Drawing Sheets

ELECTRICAL SIGNAL TAKING-OUT DEVICE

BACKGROUND OF THE INVENTION

1. Field of the Invention

The present invention relates to an electrical signal taking-out device, and more particularly to an electrical signal taking-out device for taking out an electrical signal for measurement from a circuit portion mounted on electronic/electric equipment when the equipment is checked, adjusted, or repaired.

2. Description of the Background Art

In order to take out an electrical signal for measurement from a terminal of a small electronic component mounted on a printed electronic circuit board so as to check, adjust, or repair electronic/electric equipment, a signal input unit of measuring equipment and a unit from which the electrical signal for measurement is taken out have to be electrically connected together by an electrical signal taking-out device.

In a conventional electrical signal taking-out device, which is disclosed, for example, in U.S. Pat. No. 6,307,158, metal wires provided at distal ends thereof with grip portions for holding a terminal of the electrical signal taking-out portion of an electronic circuit are extended to a rear side of the device. The device is also provided at a middle portion thereof with a pulling/pushing mechanism using a spring or the like, wherein the metal wires are extended to the rearmost portion of the device so as to be connected with an input unit of measuring equipment via electric conductive wires.

Unfortunately, in the conventional device thus constructed, the length of the metal wires for achieving a holding function is ten to twenty times longer than a minimum length required for the holding function per se. However, with a remarkable advance in electronic technologies that has been made in the recent years, the longer the metal wires extending from a tip end of a probe of an oscilloscope via the electrical signal taking-out device and the like to a circuit terminal, the more external electromagnetic noise is picked up. Moreover, these metal wires or metal portions may serve as an electric circuit element on the way to connection, so that the measurement results may be significantly different from an original waveform and a proper value of the electrical signal. This hinders advance in measuring technologies.

The present invention has been made in view of the above problem. Accordingly, an object of the present invention is to provide an electrical signal taking-out device capable of obtaining measurement results analogous to an original waveform and a proper value of an electrical signal while suppressing influence of an external electromagnetic noise to the minimum.

SUMMARY OF THE INVENTION

In accordance with the present invention, an electrical signal taking-out device for taking out an electrical signal for measurement is provided. The electrical signal taking-out device includes: a pair of metal wires provided at distal ends thereof with grip portions adapted to be connected to a terminal of an electronic circuit from which an electrical signal is taken out; a retaining member made of metal for retaining the grip portions of the metal wires so as to permit the grip portions to open and close; and an actuating mechanism for actuating the metal wires to open and close the grip portions, whereby an electrical signal taken out by the metal wires is adapted to be inputted to measuring equipment through the retaining member.

In a preferred embodiment of the present invention, the retaining member is formed to have an annular shape through which the pair of metal wires passes through.

In a preferred embodiment of the present invention, the actuating mechanism is so constructed that the pair of metal wires is biased so as to open the grip portions thereof, whereby the grip portions are opened and closed when the pair of metal wires is moved back and forth relative to the retaining member.

In a preferred embodiment of the present invention, the electrical signal taking-out device further comprises a metal cylinder connected to the retaining member and adapted to input an electrical signal taken out by the metal wires to the measuring equipment through the retaining member and the metal cylinder.

In a preferred embodiment of the present invention, the actuating mechanism includes a main body, an operating lever ratably mounted to the main body, and a sliding member attached to the operating lever and arranged to slide on the main body; and the pair of metal wires is mounted to the sliding member at proximal portions thereof so as to be advanced and retracted in relation to the retaining member by movement of the sliding member when the operating lever is operated.

In a preferred embodiment of the present invention, the main body, the operating member and the slider member are each made of a non-conductive material; the operating lever includes one end adapted to be operated and another end opposite from the one end; the retaining member is disposed on the main body; the sliding member is connected to the other end of the operating lever so as to be moved toward or away from the retaining member when the operating lever is pivotally moved; and the pair of metal wires is arranged in such a manner that the pair of metal wires are kept in contact with the retaining member at a part thereof near the grip portions thereof, whereby the metal wires are advanced in relation to the retaining member so as to open the grip portions thereof when the operating lever is pivotally moved in one direction, and the metal wires are retracted in relation to the retaining member so as to close the grip portions when the operating lever is pivotally moved in a direction opposite to the one direction.

In a preferred embodiment of the present invention, the pair of metal wires are integrally joined to each other at the proximal ends thereof to have generally a V-shaped form so as to elastically urge distal end portions thereof in directions in which the grip portions thereof are opened, whereby the pair of metal wires elastically come into contact with an inner surface of the retaining member.

In a preferred embodiment of the present invention, the electrical signal taking-out device further comprises a metal cylinder connected to the retaining member and having a hole adapted to permit a probe of the measuring equipment to be inserted thereinto.

In a preferred embodiment of the present invention, the electrical signal taking-out device further comprises a terminal electrically connected to the retaining member and adapted to be inserted into a probe of the measuring equipment.

DETAILED DESCRIPTION OF THE INVENTION

Figure 1:
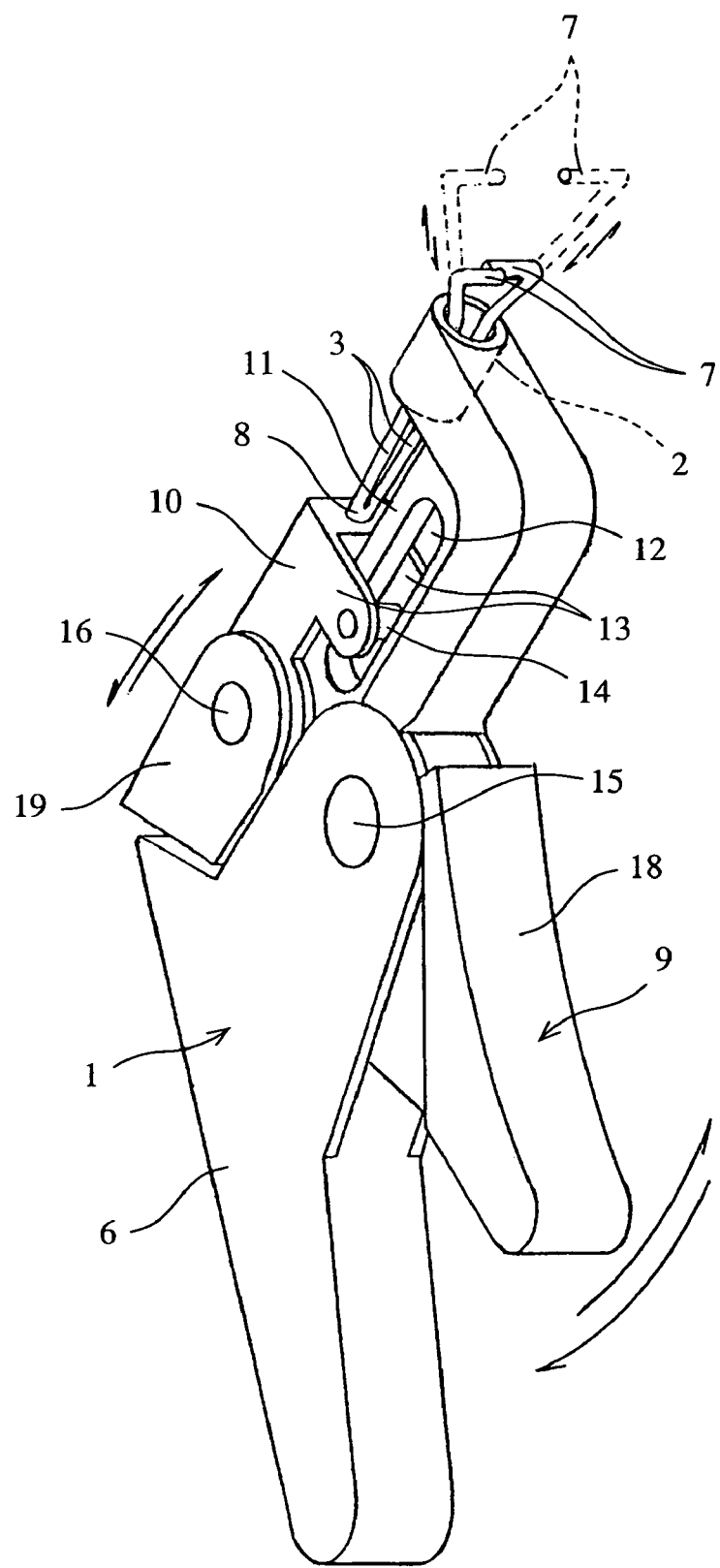
FIG. 1 is a perspective view showing an electrical signal taking-out device according to an embodiment of the present invention.

Referring first to FIG. 1, an embodiment of an electrical signal taking-out device according to the present invention is illustrated. The electrical signal taking-out device has a main body 1 provided at its front end with a retaining member 2 of an annular shape. The retaining member 2 has a pair of thin metal wires 3 passing therethrough. Also, the main body 1 includes an actuating mechanism for opening and closing the metal wires 3.

More particularly, the main body 1 is provided at its rear portion with a grip 6 and at its front end with the retaining member 2 which is made of a conductive metal, such as copper or nickel. The metal wires 3 are conductive wires made of steel or the like. The metal wires 3 have distal ends bended to form grip portions 7, respectively. The metal wires 3 are integrally joined to each other at proximal ends 8 thereof to have generally a V-shape form so as to elastically urge distal end portions thereof in directions in which the grip portions 7 thereof are opened. Therefore, the metal wires 3 always elastically come into contact with an inner surface of the retaining member 2.

The V-shaped metal wires 3 are connected to the actuating mechanism that is operated by an operating lever 9. More specifically, the proximal ends 8 of the metal wires 3 are fixed to a front end of a sliding member 10, which is disposed so as to move back and forth along a sliding surface 11 formed between the grip 6 of the main body 1 and the retaining member 2, to thereby advance and retract the metal wires 3 in relation to the retaining member 2. The sliding surface 11 has a sliding slot 12 formed therethrough and extending in a longitudinal direction. The sliding slot 12 has engaged therewith a connecting shaft 14 for connecting side pieces 13 formed on both sides of the sliding member 10. The sliding member 10 is formed so as to surround the sliding surface 11 together with both of the side pieces 13 and the connecting shaft 14. Therefore, the sliding member 10 is prevented from causing lateral and vertical movements more than required when sliding. At a center portion of the main body 1, the operating lever 9 is pivotally supported at its middle portion by an axle 15. The operating lever 9 is provided at one end thereof with a finger pulling portion 18 opposed to the grip 6 of the main body 1. The finger pulling portion 18 is always urged by a spring force so as to be moved away from the grip 6. The operating lever 9 is also connected at the other end 19 thereof to a rear end of the sliding member 10 via a shaft 16.

In the illustrated embodiment, the main body 1, the operating lever 9, and the sliding member 10 are each formed of a non-conductive material.

In the device as constructed above, the pair of metal wires 3 are elastically urged so as to open the grip portions 7 thereof away from each other. Before use, the sliding member 10 is at a retracted position. Therefore, as shown by a solid line in FIG. 1, the grip portions 7 of the metal wires 3 are held adjacent to each other inside the retaining member 2 so as to be closed.

Figure 2:
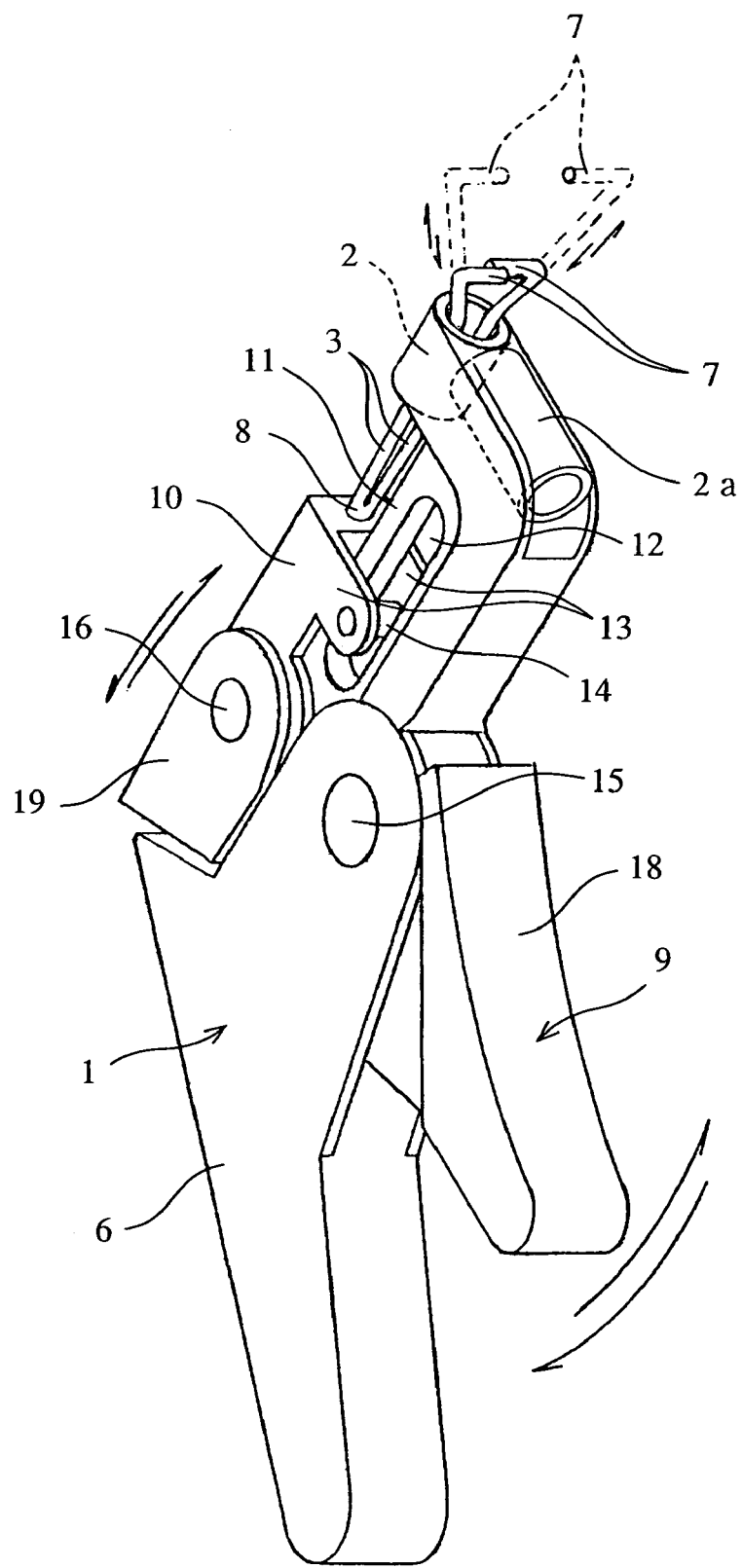
FIG. 2 is a perspective view showing an example in which the electrical signal taking-out device is actually used.

When the electrical signal taking-out device is used, as shown in FIG. 2, the main body 1 is provided at the front end thereof with a metal cylinder 2a which is made of the same material as that of the retaining member 2 and which is connected to the retaining member 2 at one end thereof while the other end of the metal cylinder 2a is formed to have an opening. The retaining member 2 and the metal cylinder 2a may be continuously and integrally formed.

Figure 3:
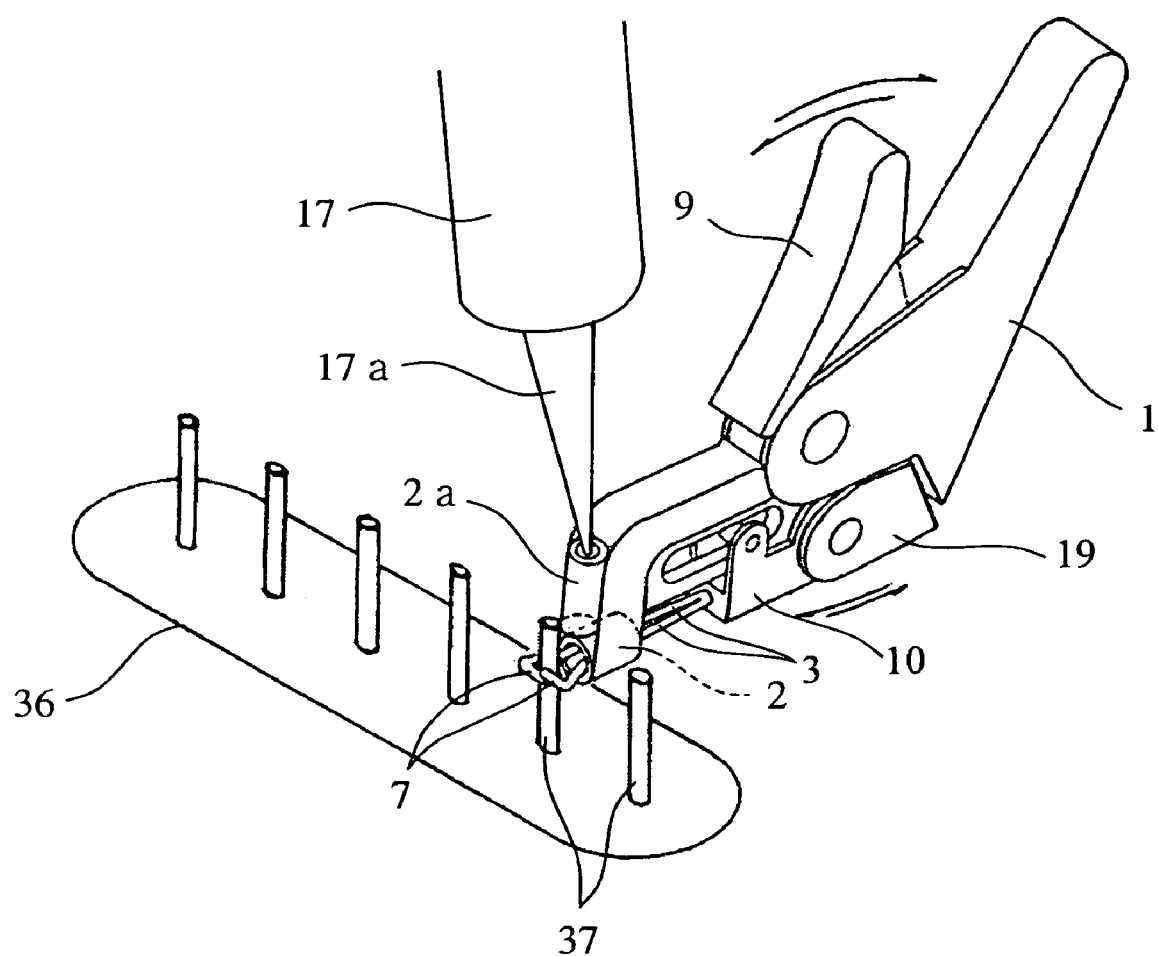
FIG. 3 is a perspective view illustrating an example of usage of the electrical signal taking-out device.

Now, an example of an actual use of the electrical signal taking-out device will be described. As shown in FIG. 3, by pulling the finger pulling portion 18 of the operating lever 9 with an index finger or the like while a thumb is laid on the grip 6, the operating lever 9 swings or pivots on the axle 15 to move the finger pulling portion 18 thereof backward and the opposite end portion 19 thereof forward, so that at the same time, the sliding member 10 slidably moves forward. Accordingly, the metal wires 3 are pushed to move forward, causing the grip portions 7 of the metal wires 3 to protrude forward to a considerable extent from the retaining member 2. Since the metal wires 3 are urged to be always opened, as shown by dotted lines in FIG. 1, the forward movement of the metal wires 3 causes the grip portions 7 to go away from the retaining member 2, whereby the metal wires 3 is released to permit the grip portions 7 to be away from each other and opened. With the grip portions 7 of the metal wires 3 being opened, the grip portions 7 are placed on opposite sides of an electrical signal taken-out terminal 37 of an electronic circuit of electronic/electric equipment 36. When a force is released from the finger pulling portion 18, the operating lever 9 pivots on the axle 15 in a reverse direction to move the finger pulling portion 18 thereof forward and the opposite end portion 19 thereof backward, so that at the same time, the sliding member 10 slidably moves backward. Consequently, the metal wires 3 are pulled back to be retracted, so that the grip portions 7 of the metal wires 3 are closed by the retaining member 2 so as to be adjacent to each other or in a closed state.

In this state, a probe 17a of a probe unit 17 connected to measuring equipment is inserted in the opening of the metal cylinder 2a. The probe 17a is tapered toward a tip thereof so as to be easily and reliably inserted. This permits an electrical signal to be taken out through the probe. The taken-out electrical signal is inputted from the grip portions 7 of the metal wires 3 via the retaining member 2 and the metal cylinder 2a to the probe unit 17, and is then measured by the measuring equipment.

In this instance, a distance between each of the grip portions 7 of the metal wires 3 and the retaining member 2 is short, resulting in the whole distance from the taken-out terminal to the probe being significantly shortened. As such, metal portions for transmitting an electrical signal are very short, to thereby reduce the possibility of picking up an external electromagnetic noise or serving as an electric circuit element on the way to connection. Therefore, measurement results analogous to an original waveform and a proper value of the electrical signal while being less subject to external electromagnetic waves.

In this connection, it is noted that the retaining member 2 is not limited to a member having an annular shape.

Also, the actuating mechanism of the metal wires is not restricted to a mechanism allowing the metal wires to move in a longitudinal direction thereof. For example, the mechanism may be configured to rotate the pair of metal wires about a center line thereof to open and close.

Figure 4:
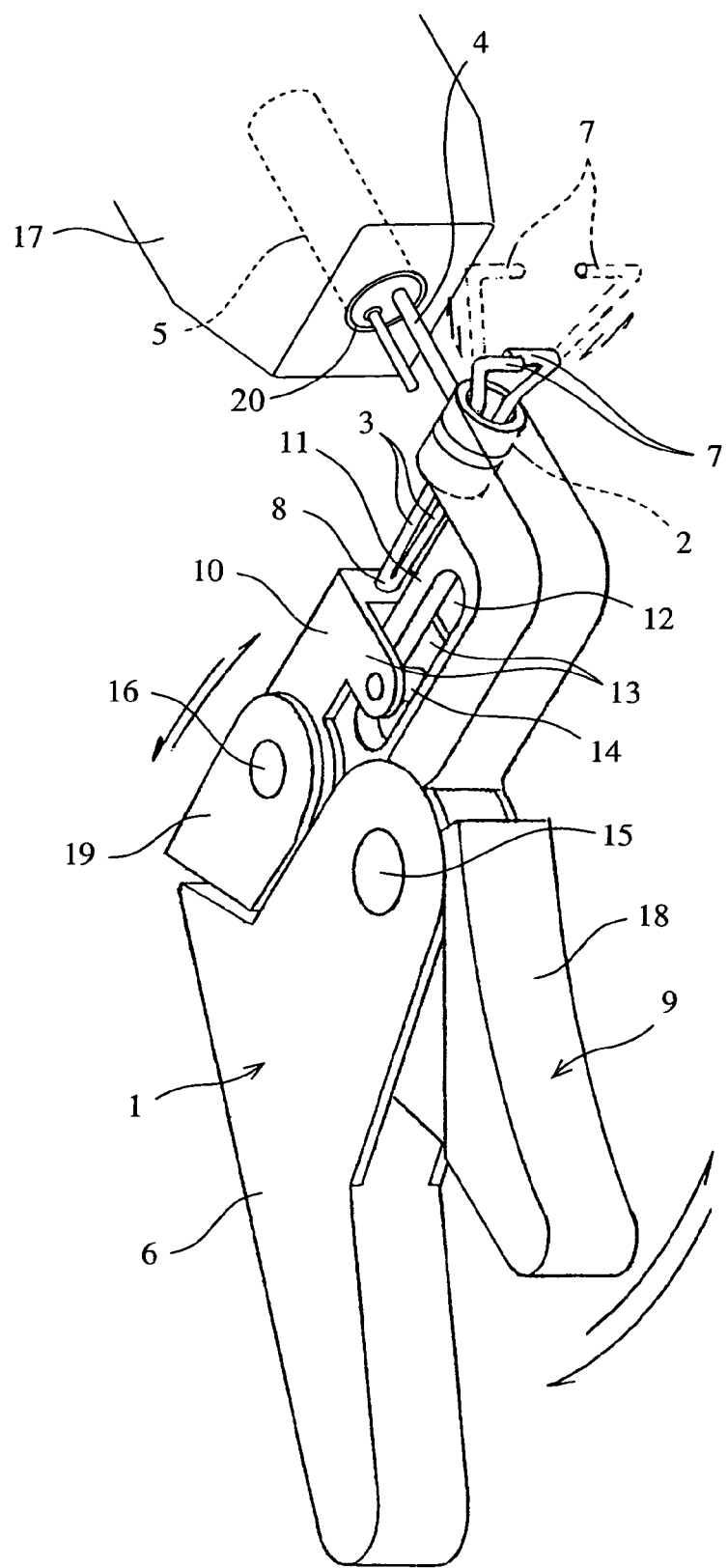
FIG. 4 is a perspective view showing another example in which the electrical signal taking-out device is used with a probe unit.

Furthermore, as shown in FIG. 4, in place of the metal cylinder 2a described above, the retaining member 2 may have a terminal 5 connected to the retaining member 2 via a lead line 4 so that the terminal 5 is inserted into a socket 20 of the probe unit 17 connected to the measuring equipment.

While the invention has been described in detail, the foregoing description is in all aspects illustrative and not restrictive. It is understood that numerous other modifications and variations can be devised without departing from the scope of the invention.

What is claimed is:

1. An electrical signal taking-out device for taking out an electrical signal to be measured, comprising:
    a pair of metal wires provided at distal ends thereof with grip portions adapted to be connected to a terminal of an electronic circuit from which an electrical signal is taken out;
    a retaining member made of metal for retaining the grip portions of the metal wires so as to permit the grip portions to open and close;
    an actuating mechanism for actuating the metal wires to open and close the grip portions, whereby an electrical signal taken out by the metal wire is adapted to be inputted to measuring equipment through the retaining member; and
    a metal cylinder connected to the retaining member and adapted to input an electrical signal taken out by the metal wires to the measuring equipment through the retaining member and the metal cylinder whereby the metal cylinder is attached to an end of the retaining member which is located near the grip portions of the metal wires, and the metal cylinder has an opening for receiving therein an input probe of the equipment.

2. The electrical signal taking-out device as defined in claim 1, wherein the retaining member is formed to have an annular shape through which the pair of metal wires passes through.

3. The electrical signal taking-out device as defined in claim 2, wherein the actuating mechanism is so constructed that the pair of metal wire is biased so as to open the grip portions thereof, whereby the grip portions are opened and closed when the pair of metal wires is moved back and forth relative to the retaining member.

4. The electrical signal taking-out device as defined in claim 3, wherein the actuating mechanism includes a main body, an operating lever rotably mounted to the main body, and a sliding member attached to the operating lever and arranged to slide on the main body; and
    the pair of metal wires is mounted to the sliding member at proximal portions thereof so as to be advanced and retracted in relation to the retaining member by movement of the sliding member when the operating lever is operated.

5. The electrical signal taking-out device as defined in claim 4, wherein the main body, the operating member and the slider member are each made of a non-conductive material;
    the operating lever includes one end adapted to be operated and another end opposite from the one end;
    the retaining member is disposed on the main body;
    the sliding member is connected to the other end of the operating lever so as to be moved toward or away from the retaining member when the operating lever is pivotally moved; and
    the pair of metal wires is arranged in such a manner that the pair of metal wires are kept in contact with the retaining member at a part thereof near the grip portions thereof whereby the metal wires are advanced in relation to the retaining member so as to open the grip portions thereof when the operating lever is pivotally moved in one direction, and the metal wires are refracted in relation to the retaining member so as to close the grip portions when the operating lever is pivotally moved in a direction opposite to the one direction.

6. The electrical signal taking-out device sa defined in claim 5, further comprising a guiding means, provided on the main body, for guiding the sliding member in moving linearly in the longitudinal direction of the metal wires.

7. The electrical signal taking-out device as defined in claim 6, wherein the pair of metal wires are integrally joined to each other at the proximal ends thereof to have generally a V-shaped form so as to elastically urge distal end portions thereof in directions in which the grip portions thereof are opened, whereby the pair of metal wires elastically come into contact with an inner surface of the retaining member.

8. The electrical signal taking-out device as defined in claim 7, further comprising a metal cylinder connected to the retaining member and having a hole adapted to permit a probe of the measuring equipment to be inserted thereinto.

9. The electrical signal taking-out device as defined in claim 7, further comprising a terminal electrically connected to the retaining member and adapted to be inserted into a probe of the measuring equipment.

10. An electrical signal taking-out device for taking out an electrical signal to be measured, comprising:
    a pair of metal wires provided at distal ends thereof with grip portions adapted to be connected to a terminal of an electronic circuit from which an electrical signal is taken out;
    a retaining member made of metal having an annular shape for retaining the grip portions of the metal wires as the metal wires pass through the retaining member so as to permit the grip portions to open and close;
    an actuating mechanism for actuating the metal wires to open and close the grip portions, whereby an electrical signal taken out by the metal wires is adapted to be inputted to measuring equipment through the retaining member wherein the satiating mechanism is so constructed that the pair of metal wires is biased so as to open the grip portions thereof, whereby the grip portions are opened and closed when the pair of metal wires is moved back and forth relative to the retaining member; the actuating mechanism includes a main body, an operating lever rotably mounted to the main body, and a sliding member attached to the operating lever and arranged to slide in a linear direction on the main body; and
    the pair of metal wires is mounted to the sliding member at proximal portions thereof so as to be advanced and retracted in relation to the retaining member by movement of the sliding member when the operating lever is operated; and
    a metal cylinder connected to the retaining member and adapted to input an electrical signal taken out by the metal wires to the measuring equipment trough the retaining member and the metal cylinder,
    wherein the main body, the operating member and the slider member are each made of a non-conductive material;
    the operating lever includes one end adapted to be operated and another end opposite from the one end;
    the retaining member is disposed on the main body;

the sliding member is connected to the other end of the operating lever so as to be moved toward or away from to retaining member when the operating lever is pivotally moved; and the pair of metal wires is arranged in such a manner that the pair of metal wires are kept in contact with the retaining member at a part thereof near the grip portions thereof, whereby to metal wires are advanced in relation to the retaining member so as to open the grip portions thereof when the operating lever is pivotally moved in one direction, and the metal wires are retracted in relation to the retaining member so as to close the grip portions when the operating lever is pivotally moved in a direction opposite to the one direction.

11. An electrical signal taking-out device for securing an electrical signal to be measured, comprising a pair of metal members provided at distal ends thereof with grip portions adapted to be connected to a terminal of an electronic circuit from which an electrical signal is taken out, the grip portions are biased away from each other;

a conductive retaining member relatively movable along a first axis to the pair of metal members to provide an opening and closing of the distal ends of the metal members on the terminal, the conductive retaining member having an offset connector opening relative to the first axis of a size to receive an input probe of a measuring equipment to take out the electrical signal adjacent the grip portions, wherein the conductive retaining member includes a first cylinder connect to the which the pair of metal members pass through and a second cylinder electrically connected to the first cylinder to provide the offset connector opening; and an actuating mechanism for providing a relative movement of to pair of metal members and the conductive retaining member.

12. The electrical signal taking-out device as defined in claim 11 where the actuating device includes a handle and a movable lever for moving the pair of metal members in a linear direction through the conductive retaining member.

* * * * *